United States Patent
Wang et al.

(10) Patent No.: US 6,815,971 B2
(45) Date of Patent: Nov. 9, 2004

(54) METHOD AND APPARATUS FOR STRESS TESTING INTEGRATED CIRCUITS USING AN ADJUSTABLE AC HOT CARRIER INJECTION SOURCE

(75) Inventors: Chien-Jung Wang, Kaohsiung (TW); Shih-Liang Wang, Ping Tung (TW); Chao-Hao Cheng, Jungli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 53 days.

(21) Appl. No.: 10/289,994

(22) Filed: Nov. 6, 2002

(65) Prior Publication Data

US 2004/0085084 A1 May 6, 2004

(51) Int. Cl.$^7$ .............................................. G01R 31/26
(52) U.S. Cl. ....................................................... 324/765
(58) Field of Search .................................. 324/769, 765, 324/763, 158.1, 760

(56) References Cited

U.S. PATENT DOCUMENTS

| 4,697,140 A | * | 9/1987 | Saito et al. ................. 324/73.1 |
| 6,242,937 B1 | * | 6/2001 | Lee et al. .................... 324/769 |
| 6,545,484 B1 | * | 4/2003 | Yoshioka ..................... 324/527 |

* cited by examiner

Primary Examiner—David A. Zarneke
Assistant Examiner—Tung X. Nguyen
(74) Attorney, Agent, or Firm—Tung & Associates

(57) ABSTRACT

A method and apparatus is provided for stress testing integrated circuits to determine their susceptibility to hot carrier charge injection damage. The system includes a hot carrier injection source formed on a semiconductor wafer carrying the ICs under test. The carrier source comprises an adjustable, voltage controlled oscillator having a variable frequency AC output test signal, and a modulator circuit for varying the duty cycle of the test signal applied to the ICs.

13 Claims, 2 Drawing Sheets

METHOD AND APPARATUS FOR STRESS TESTING INTEGRATED CIRCUITS USING AN ADJUSTABLE AC HOT CARRIER INJECTION SOURCE

TECHNICAL FIELD

The present invention broadly relates to reliability testing of integrated circuits during manufacture, and deals more particularly with a method and apparatus for stress testing integrated circuits using hot carrier injection.

BACKGROUND OF THE INVENTION

Integrated circuits are manufactured by forming a multitude of individual chips in and on the surface of a semiconductor wafer. Upon completion, the wafer surface is typically covered with identical areas of patterning, with each area defining a single chip or integrated circuit, sometimes referred to as a die. The dies are separated from each other by regions that normally do not contain circuitry, which are commonly known as scribe lines. The areas defining the scribe line areas are eventually sawn through to separate the wafer into individual die.

Wafer fabrication requires a high degree of precision. One mistake can render an individual die or perhaps an entire wafer completely useless. Therefore, as the wafer proceeds through fabrication processing steps, it is subjected to a variety of tests and evaluations. Toward the end of the fabrication process, the IC devices are more fully characterized and tested before the wafer is converted into individual die, in order to determine their reliability and failure probability.

Early test equipment tested individual ICs on the wafer using needle-like probes which were positioned into contact with bonding pads on the IC's in order to apply desired test voltages and currents. More recently, however, so-called on-wafer tests have been performed which function to carry out individual testing and characterization of individual IC's, thereby eliminating the time consuming process of probing each die. In some cases, such test circuits are formed on each individual die, however the disadvantage of this approach lies in the "real estate" that must be devoted to the test circuitry. In other cases, test circuits are formed within the areas defining the scribe lines. This latter approach has the advantage of making more area of the wafer available for forming ICs, and thus generally allows more IC's to be manufactured from each wafer.

As indicated above, part of the testing that is conducted on individual IC's before the wafer is sawed into individual die relates to reliability. The ICs are subjected to various types of tests to determine and predict the reliability of the structure used for interconnections and transistors. These structures are placed under various dynamically varied environmental and other stress conditions. Typical tests include electromigration, stress migration, hot carrier injection and gate oxide integrity. Hot carrier degradation is of particular interest because, as devices are scaled to smaller geometries, the electric field between drain and source and across the oxide becomes larger, increasing the probability that impact ionization will occur and charged "hot carriers" will create interface damage or be injected into the oxide. When interface damage or charge trapping occurs in the oxide, device performance may degrade to the point of circuit failure. In some cases, hot carrier damage causes the transistor transconductance to slowly degrade and eventually may cause the transistor's threshold to change near the drain edge of the channel such that it cannot form a channel in the drain region. This mechanism can be more damaging to digital circuits because it will cause parts of the digital circuits to have longer delay than originally intended.

Self stressing test structures for determining susceptibility of an IC to hot carrier degradation are known in the art. These test structures typically employ an AC controlled oscillator which outputs a time varying voltage that is applied to test the IC. This AC controlled oscillator is sometimes referred to as an AC hot carrier injection stress test circuit and employs a standard ring oscillator which serves as a stable signal source, having a fixed frequency. It has been found that the application of a single pulse of fixed frequency to the device under test does not always produce an accurate prediction of the reliability or useful life of the device under test. This is because under actual operating circumstances, the device may be subject to multiple pulses of various durations and/or multiple frequencies which cause the device to respond much differently to possible hot carrier degradation. Accordingly, there is a need in the art for a method and apparatus for testing integrated circuits for their susceptibility to hot carrier injection degradation which overcomes the problems mentioned above and provides more accurate test results. The present invention is directed towards satisfying this need.

SUMMARY OF THE INVENTION

According to one aspect of the invention, an on-wafer, hot carrier test system for stressing integrated circuits is provided that includes an adjustable oscillator circuit and a modulator circuit. The oscillator circuit produces an alternating current test signal having a variable frequency, and the modulator circuit is adjustable in order to adjust the duty cycle of the test signal. The input of the oscillator circuit is coupled with an adjustable voltage source, such that the frequency of the test signal is related to the magnitude of the voltage applied to the oscillator circuit input. The modulator circuit includes an input connected with an adjustable voltage source, such that the length of the duty cycle is related to the magnitude of the coupled voltage applied to the modulator circuit input.

According to another aspect of the invention, a method is provided for stress testing integrated circuits formed on a semiconductor wafer using an on wafer, hot carrier injection source comprising the steps of: producing an AC test signal using an oscillator formed on the wafer, adjusting the frequency of the test signal, adjusting the duty cycle of the test signal and applying the test signal to integrated circuits formed on the wafer.

Accordingly, it is a primary object of the present invention to provide a novel method and apparatus for reliability testing of integrated circuits formed on a semiconductor wafer.

Another object of the invention is to provide a method and apparatus above in which the test structure is formed directly on the wafer as part of the semiconductor manufacturing process.

A further object of the invention is to provide a method and apparatus of the type described above which provides more robust testing of integrated circuits under wider dynamic test conditions in order to provide improved predictability of failure modes and service life.

A still further object of the invention is to provide a method and apparatus as described above which allows variation of both the frequency and duty cycle of test signals applied to the integrated circuits under test.

These, and further objects and advantages of the invention will be made clear or will become apparent during the course of the following description of a preferred embodiment of the invention.

BRIEF DESCRIPTION OF THE DRAWINGS

In the drawings which form an integral part of the specification and are to be read in conjunction therewith, and in which like reference numerals are employed to designate identical components in the various views.

DESCRIPTION OF THE PREFERRED EMBODIMENT

Figure 1:
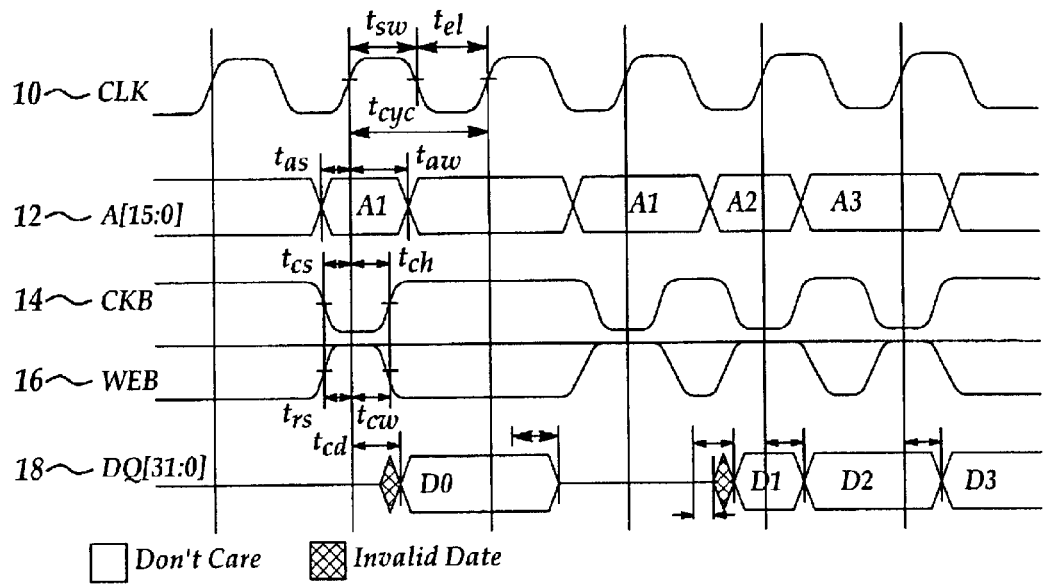
FIG. 1 is a series of timing wave form diagrams of the read cycle of a synchronous SRAM.

Integrated circuits (ICs) employ complex networks of transistors and other active devices that must operate in a highly reliable and repeatable manner, with consistent operating times. For example, memory devices such as SRAM's employs circuitry that has multiple switchable functions wherein the timing of data access and transmission is critical. An example of this complex relationship is shown in FIG. 1 which depicts, in waveforms 10–18, the interrelationship between a clock signal, address, read/write, and data transfer in a synchronous SRAM. From these wave forms plots it may be appreciated that the various functions of the SRAM must be highly repeatable in terms of the timing of their operation because of the interdependency of multiple operating functions.

Figure 4:
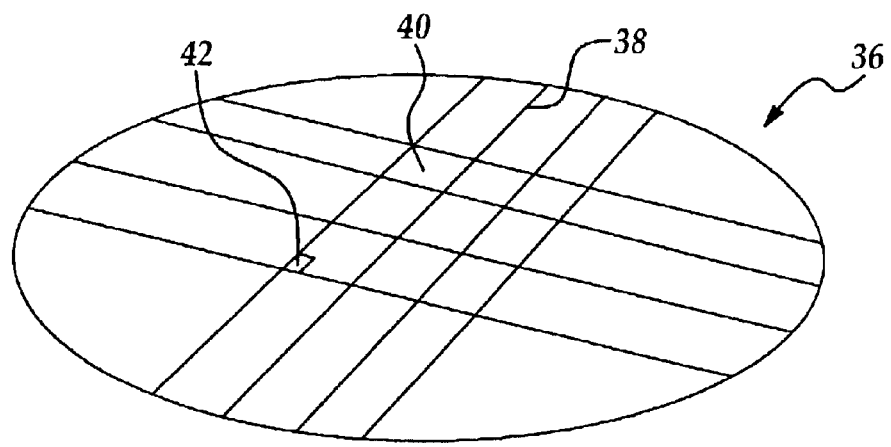

In order to assure that each IC containing an SRAM on a wafer is operating properly before the wafer is converted into individual die, an on-wafer hot carrier test system is provided for stress testing each of a plurality of ICs 40 formed on a semiconductor wafer 36. (FIG. 4). As is well known in the art, the integrated circuits 40 which may be SRAM's or other devices, are formed on the wafer 36 such that they are separated from each other by scribe lines 38 which define areas upon which no components are formed and later define the path of a saw which is used to separate the wafer 36 into individual die. "On-wafer" refers to the fact that the test system is formed on the wafer 36 itself, in contrast to some test systems that are separate from the wafer 36 and are connected to the individual IC's 40 by means of test probes. The test circuit may be formed integral with the ICs 40 or may be formed in one or more blank spaces, where ICs 40 would ordinarily be formed. Alternatively, as is well known in the art, the test circuit may be formed within the space defined by the scribe lines 38. After the testing procedure is completed, the test circuits formed within the scribe lines 38 are destroyed when the wafer 36 is separated into the individual die.

Figure 2:
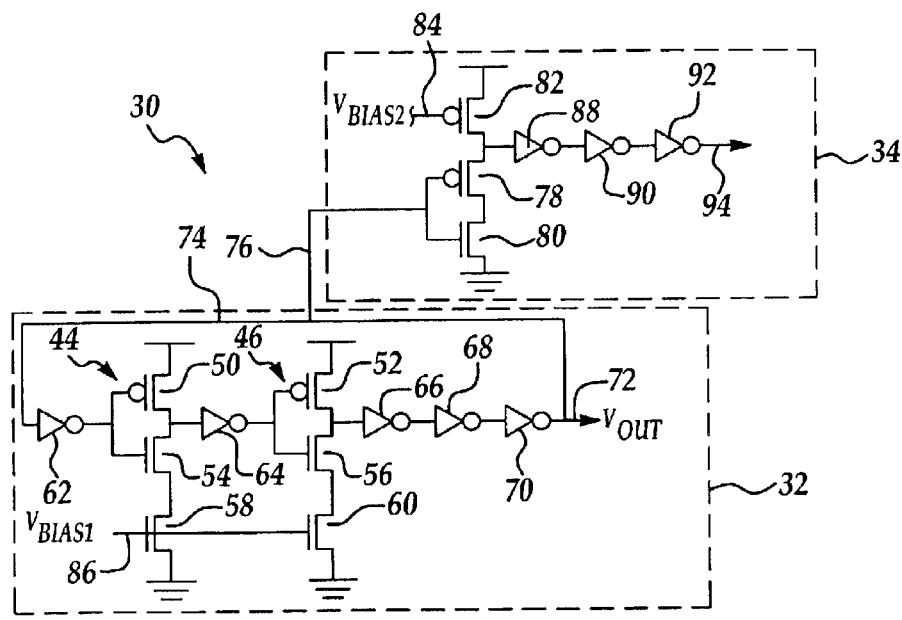
FIG. 2 is a detailed schematic circuit diagram of the AC hot carrier injection stress source forming the preferred embodiment of the invention.

Referring now to FIG. 2, the test system 30 broadly includes a voltage controlled oscillator circuit (VCO) 32 and a modulator circuit 34 for controlling the duty cycle of a test signal produced by the oscillator 32. The VCO 32 outputs a time varying test signal $V_{out}$ on line 72 which is applied to stress an IC 40, also referred to as a device under test (DUT), which may comprise, by way of example, a synchronous SRAM. The test signal $V_{out}$ applied to the DUT 40 stresses the DUT 40 in manner that determines the DUT's resistance to degradation as a result of hot carrier charge injection. Line 72 is connected to one or more of the DUT's 40 by conductive paths (not shown) formed on the wafer as part process used to fabricate the ICs 40 on the wafer 36. As will be discussed below in more detail, the test signal applied to the DUT 40 by the present test system 30 better determines the DUT's reaction to hot carrier injection under actual operating conditions, compared to prior test systems, due to the fact that both the frequency and duty cycle of the applied test signal can be varied.

The VCO 32 is formed by an odd number of differential delay circuits connected in a ring to form a ring oscillator, wherein the output of the last delay circuit is connected with the input of the first delay circuit. Each of these delay circuits outputs a signal that is an inverted and delayed version of its input signal. The VCO 32 produces an output on line 72 that is a periodic or AC signal whose frequency is determined in part by the phase delay produced by each of the delay circuits, and in part by a bias voltage $V_{bias\ 1}$ applied to the VCO 32 on input line 86. $V_{bias\ 1}$ effectively adjusts the phase delay produced by the delay circuits and thus, the frequency of the output signal $V_{out}$. In the illustrated embodiment, the VCO 32 includes inverters 44, 46 and 62–70 coupled in series with each other. Inverters 44, 46 are respectively coupled in series with current mirrors 58, 60, which are in the form of N type transistors controlled by the input bias voltage $V_{bias\ 1}$. Inverter 44 comprises a pair of JFET's 50,54, and inverter 46 similarly comprises a pair of JFETs 52,56. The bias voltage $V_{bias\ 1}$ effectively controls the current flowing through inverters 44,46, and thus determines the propagation delay through these inverters. This propagation time in turn determines the frequency of the test signal $V_{out}$ output to the DUT 40 on line 72.

The feedback path completing the "ring" is defined by line 74 which couples the output of inverter 70 with the input of inverter 62. The output of inverter 70 is also coupled by line 76 to the modulator circuit 34. Modulator circuit 34 includes three JFETs 78, 80, 82 which have their source-to-drain paths coupled in series, as well as 3 series connected inverters 88, 90, 92 which are coupled to receive the signal flowing between JFETs 78 and 80. The output of the modulator circuit 34 on line 94 is delivered to the DUT 40 and functions to control the duty cycle of the test signal applied to the DUT 40 through line 72. The duty cycle, i.e. the ratio of the time that the test signal is on to the time it is off, is determined by the level of a bias voltage $V_{bias\ 2}$ applied on line 84 to control the conductance of JFET 82.

Figure 3:
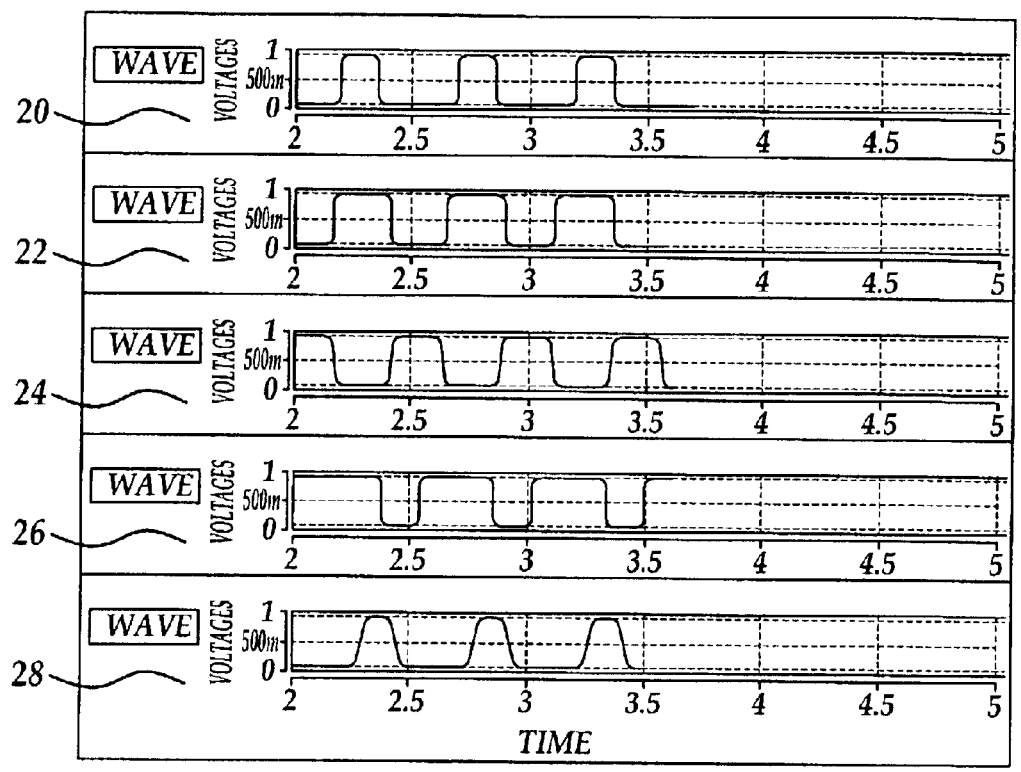
FIG. 3 is a series of waveform diagrams showing the output test signal produced by the stress source of FIG. 2; and, FIG. 4 is a perspective view a semiconductor wafer having the stress source circuit of FIG. 2 formed thereon.

FIG. 3 shows waveform diagrams 20–28 representing several different test signals output by the test system 30, and depicts various combinations of frequencies and duty cycles which can be applied to the same or different DUTs 40, in order to test a DUT 40 under a variety of operating conditions, including pulsed operation as is required when testing SRAMs.

From the foregoing, it is apparent that the IC stress testing method and apparatus described above not only provides for the reliable accomplishment of the objects of the invention, but does so in a particularly effective and economic manner. It is recognized, of course, that those skilled in the art may make various modifications or additions chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. An on-wafer hot carrier test system for stress testing integrated circuits formed on said wafer, comprising:

an adjustable oscillator circuit for producing an alternating current test signal having a variable frequency, said oscillator circuit having an input and having an output coupled with each of said integrated circuits; and, a modulator circuit coupled with said oscillator circuit for adjusting the duty cycle of said test signal, wherein said modulator circuit includes a first input coupled with an adjustable voltage source, and the length of said duty cycle is related to the magnitude of the a signal delivered to said first input from said voltage source, said modulator circuit includes at least one transistor controlled by a bias voltage determined by the magnitude of the signal delivered to said first input from said voltage source.

2. The test circuit of claim 1, wherein said input of said oscillator circuit is coupled with an adjustable voltage source, and the frequency of said test signal is related to the magnitude of a signal delivered to said input from said voltage source.

3. The system of claim 2, wherein said oscillator circuit includes at least one transistor controlled by a bias voltage determined by the magnitude of the signal delivered to said input from said voltage source.

4. The system of claim 3, wherein said oscillator circuit includes at least one inverter coupled between said transistor and said output for inverting the signal delivered to said output.

5. The system of claim 1, wherein:

said oscillator circuit includes a feedback loop coupled between the input and output of said oscillator circuit, and said modulator circuit includes a second input coupled with said feedback loop.

6. A hot carrier test system formed on a semiconductor wafer for stress testing individual integrated circuits on said wafer, comprising:

a variable frequency oscillator having an output for applying a test signal to an integrated circuit under test, said test signal having a changeable frequency, wherein said variable frequency oscillator includes an input for receiving a changeable voltage, the value of said voltage determining the frequency of said test signal; and, means coupled with said oscillator for adjusting a duty cycle of said test signal applied to said integrated circuit under test, wherein said duty cycle adjusting means includes a modulator circuit having an input connected with said oscillator output, and having an output, said modulator circuit includes a pair of transistors having their source-to-drain paths coupled in series, and controlled by the voltage of said test signal output by said oscillator.

7. The system of claim 6, wherein said variable frequency oscillator includes a plurality of series connected inverters arranged to form a ring oscillator.

8. The system of claim 7, wherein the number of said inverters is an odd number.

9. The system of claim 6, wherein said duty cycle adjusting means includes an input for receiving a second changeable voltage, the value of said second changeable voltage determining said duty cycle.

10. The system of claim 6, wherein said modulator circuit includes an odd number of inverters coupled in series with each other and with said output of said modulator circuit.

11. A method for stress testing integrated circuits formed on a semiconductor wafer using hot carrier injection, comprising the steps of:

(A) producing an A.C. test signal using an oscillator formed on said wafer;

(B) adjusting the frequency of said test signal, by changing the value of a supply voltage, and applying said voltage to an input of said oscillator circuit;

(C) adjusting the duty cycle of said test signal, by changing the value of a second supply voltage, and applying said second voltage to an input of said modulator circuit; and, (D) applying said test signal to an integrated circuit on said wafer.

12. The method of claim 11, wherein set (A) is performed using a ring oscillator.

13. The method of claim 11, wherein step (C) includes feeding the test signal output from said oscillator to an input of said modulator circuit.

* * * * *